Figure 1:
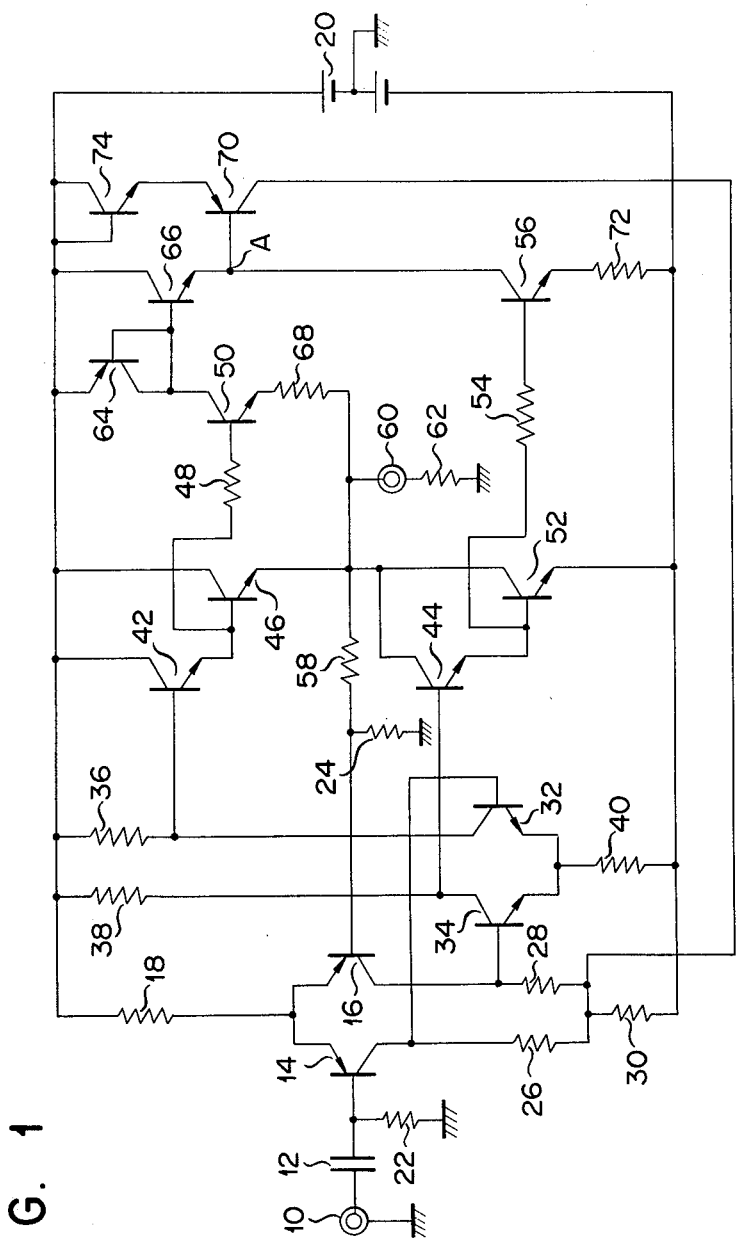

United States Patent [19]

Yamaguchi et al.

[11] 4,330,755
[45] May 18, 1982

[54] POWER-AMPLIFYING CIRCUIT

[75] Inventors: Hiroyasu Yamaguchi, Yokohama; Takashi Ishii, Fujisawa, both of Japan

[73] Assignee: Tokyo Shibaura Denki Kabushiki Kaisha, Japan

[21] Appl. No.: 134,302

[22] Filed: Mar. 26, 1980

[30] Foreign Application Priority Data

Mar. 31, 1979 [JP] Japan .................................. 54-38638

[51] Int. Cl.³ .............................................. H03F 3/26
[52] U.S. Cl. ..................................... 330/271; 330/265
[58] Field of Search ......................... 330/265, 271, 297

[56] References Cited

U.S. PATENT DOCUMENTS

| 2,789,164 | 4/1957 | Stanley | 330/265 |
| 3,434,069 | 3/1969 | Jones | 330/50 |
| 3,904,974 | 9/1975 | Fukaya | 330/265 |
| 4,041,407 | 9/1977 | Main | 330/13 |
| 4,077,012 | 2/1978 | Iwamatsu | 330/253 |

FOREIGN PATENT DOCUMENTS

| 2711912 | 9/1977 | Fed. Rep. of Germany . |
| 1131217 | 10/1968 | United Kingdom . |
| 1440079 | 6/1976 | United Kingdom . |
| 1461808 | 1/1977 | United Kingdom . |

OTHER PUBLICATIONS

Office Action from West Germany dated Nov. 5, 1980 (translation).
Search Report from the French Republic dated May 29, 1981 (translation).
J. H. Huijsing and Frans Tol "Monolithic Operational Amplifier Design with Improved HF Behavior," IEEE Journal of Solid–State Circuits, vol. SC-11, No. 2, Apr. 1976, pp. 323-328.

Primary Examiner—Michael J. Tokar
Attorney, Agent, or Firm—Finnegan, Henderson, Farabow, Garrett & Dunner

[57] ABSTRACT

A power-amplifying circuit includes a differential amplifier wherein the base of one of the transistors is supplied with an input signal and the collectors of both transistors are respectively supplied with signals amplified in the non-inverting form and the inverting form, two output transistors carrying out a push-pull operation upon receipt of output signals from both transistors of the differential amplifier, third and fourth transistors for detecting output currents from both transistors of the output transistors, and a circuit for supplying a current corresponding to a product of output currents from the first and second transistors to the differential amplifier through a negative feedback path. A compensation resistor is connected to one of the bases and emitters of the third and fourth transistors to counterbalance a parasitic resistance occurring in the first and second transistors.

5 Claims, 6 Drawing Figures

F I G. 3
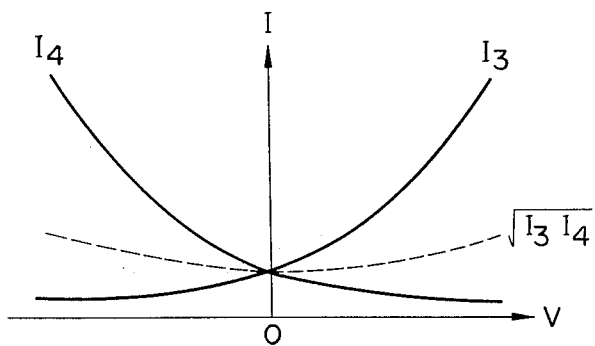
F I G. 4
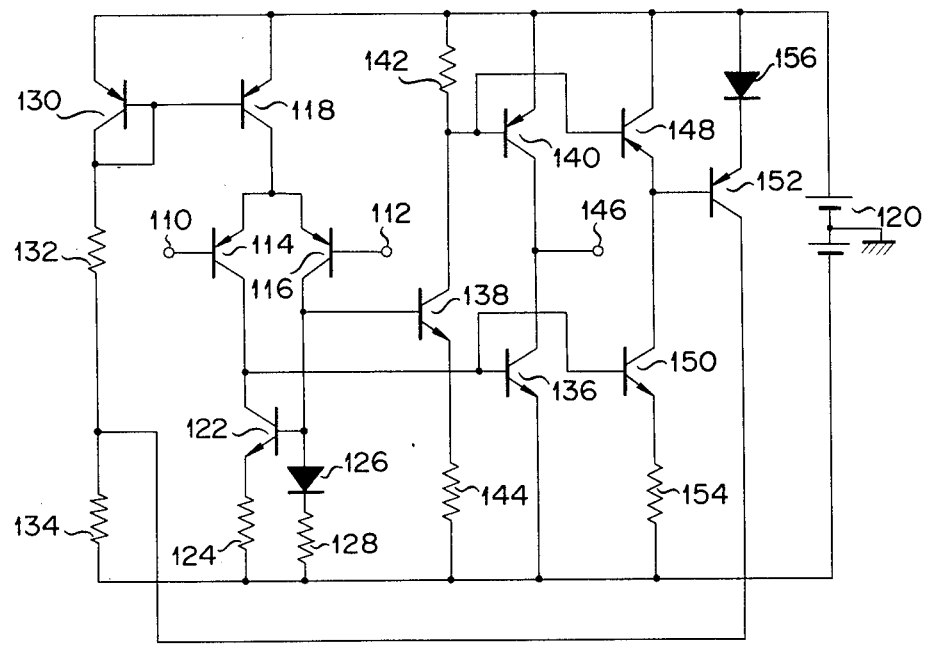

POWER-AMPLIFYING CIRCUIT

This invention relates to a power-amplifying circuit having a push-pull pair of transistors in an output stage.

The conventional integrated power-amplifying circuit presents difficulties in manufacturing a large power PNP type transistor. Therefore, the output stage of the power-amplifying circuit is formed of a quasi-complementary type single-ended push-pull amplifier. However, a lateral type PNP transistor used in the push-pull amplifier has a small current capacity, a low current amplification factor, and a small gain band width product ($f_t$), and consequently is ready to give rise to oscillations, failing to manufacture a high power-amplifying circuit. Where both transistors of the complementary pair of transistors of the output stage are in common emitter configuration, then the amplitude of an output signal can be increased even without providing a bootstrap circuit. However, difficulties arise in defining the idle (quiescent) current of the transistors of the output stage for thermal stability and for elimination of crossover distortions in class AB or B. Or where the output stage of a power-amplifying circuit is formed of transistors of the same polarity (for example, the NPN type transistors which have a large current capacity) instead of the complementary pair of transistors, then the chip size of the circuit can be made small since it is not necessary to use a large chip size lateral type transistor. But in this case, too, it is difficult to properly define the quiescent current of the output transistors for elimination of the above-mentioned crossover distortions.

It is accordingly the object of this invention to provide a power-amplifying circuit in which the quiescent current of the push-pull pair of transistors of the output stage can be easily set at a prescribed level, thereby eliminating crossover distortions and carrying out the class A or AB push-pull operation steadily and unfailingly, and further which is well adapted for a monolithic integration circuit.

To this end, the present invention provides a power-amplifying circuit which comprises a pre-amplifier means which amplifies an input signal and sends forth an output at two output terminals in differential modes with respect to each other; an output means including first and second transistors which carry out a push-pull operation; and an operation means which detects output signals from the first and second transistors, supplies a signal corresponding to a product of both output signals to the pre-amplifier means through a negative feedback path to regulate signals of the first and second transistors, and is provided with a compensation resistor which is connected to a signal path extending from the output means to the pre-amplifier means to counterbalance a parasitic resistance in the first and second transistors.

Figure 2A:
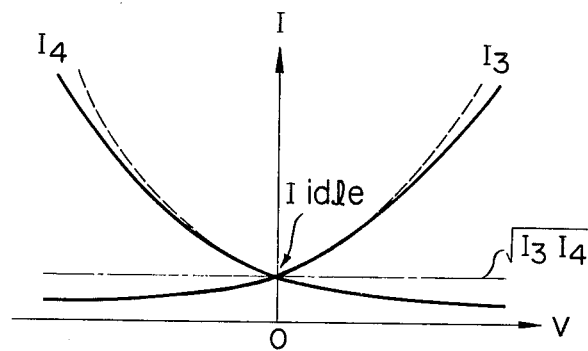
Figure 2B:
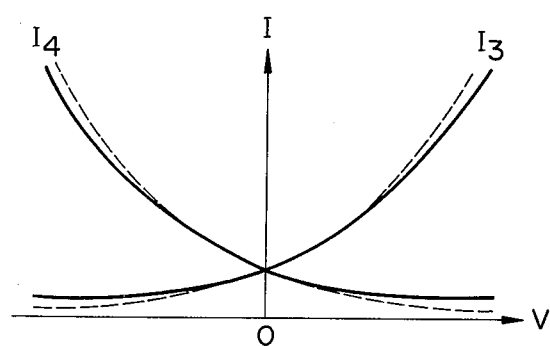
Figure 5:
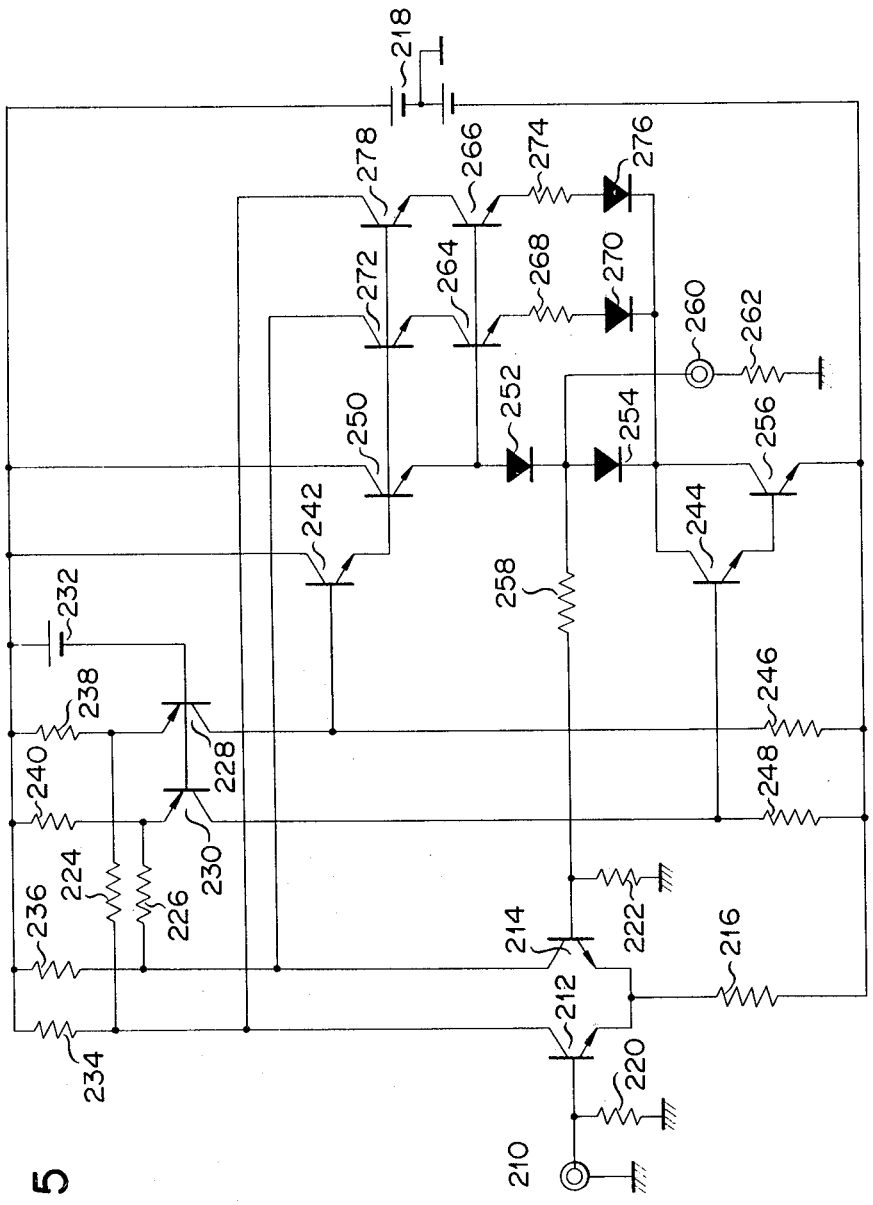

This invention can be more fully understood from the following detailed description when taken in conjunction with the accompanying drawings, in which:

FIG. 1 shows the arrangement of a power-amplifying circuit according to a first embodiment of this invention;

FIGS. 2A, 2B and FIG. 3 graphically indicate the output characteristics of the power-amplifying circuit of FIG. 1 by way of illustrating the operation thereof;

FIG. 4 set forth the arrangement of a power-amplifying circuit according to a second embodiment of the invention; and FIG. 5 shows the arrangement of a power-amplifying circuit according to a third embodiment of the invention.

A power-amplifying circuit according to the first embodiment of this invention is now described with reference to FIG. 1 showing its arrangement. An input terminal 10 which is supplied with a signal whose power is to be amplified (hereinafter referred to as "an input signal") is formed of a jack whose outer terminal is grounded and whose inner terminal is connected to the base of a PNP type transistor 14 through a capacitor 12. The emitter of the transistor 14 is connected to the emitter of a PNP type transistor 16, and also to the positive terminal of a D.C. power source 20 through a resistor 18. The bases of the transistors 14 and 16 are respectively grounded through the corresponding resistors 22 and 24. The collectors of the transistors 14 and 16 are connected to one end of a resistor 30 through the corresponding resistors 26 and 28. The other end of the resistor 30 is connected to the negative terminal of the D.C. power source 20. The transistors 14 and 16 jointly forms a differential amplifier of a pre-amplifier stage.

The collectors of the transistors 14 and 16 are respectively connected to the bases of the NPN type transistors 32 and 34, whose collectors are respectively connected to the positive terminal of the D.C. power source 20 through the corresponding resistors 36 and 38. The emitters of the transistors 32 and 34 are commonly connected and are connected to the negative terminal of the D.C. power source through a resistor 40. The collectors of the transistors 32 and 34 are respectively connected to the bases of NPN type transistors 42 and 44. Thus, the transistors 32 and 34 jointly constitute a differential amplifier of a drive stage for the transistors 42 and 44. The collector of the transistor 42 is connected to the collector of an NPN type transistor 46. The emitter of the transistor 42 is connected to the base of the transistor 46 and also to the base of an NPN type transistor 50 through a compensation resistor 48. The collector of the transistor 44 is connected to the collector of an NPN type transistor 52. The emitter of the transistor 44 is connected to the base of the transistor 52, and also to the base of an NPN type transistor 56 through a compensation resistor 54. In other words, the transistors 42 and 46 constitute a Darlington pair. Similarly, the transistors 44 and 52 constitute a Darlington pair. The collector of the transistor 46 is connected to the positive terminal of the D.C. power source 20. The emitter of the transistor 46 is connected to the collector of the transistor 52, and also to the base of the transistor 16 through a resistor 58. The emitter of the transistor 46 is also connected to the inner terminal of a jack constituting an output terminal 60. The outer terminal of the jack of the output terminal 60 is grounded through a load 62, such as a speaker. The emitter of the transistor 52 is connected to the negative terminal of the D.C. power source 20. The transistors 42, 44, 46 and 52 jointly constitute an output stage of the power-amplifying circuit. In other words, the output stage of the power-amplifying circuit is formed of the NPN type transistors. The transistors 50 and 56 constitute the detection stage of the output transistors 46 and 52.

The collector of the transistor 50 is connected to the base and collector of a PNP type transistor 64, and also to the base of an NPN type transistor 66. The emitter of the transistor 50 is connected to the emitter of the output transistor 46 through a compensation resistor 68. Thus, the transistor 64 acts as a diode, with the base and collector short-circuited. The emitter of the transistor 66 is connected to the collector of the transistor 56 and the base of a PNP type transistor 70. The emitter of the transistor 56 is connected to the negative terminal of the D.C. power source 20 through a compensation resistor 72. The emitter of the transistor 70 is connected to the emitter of an NPN type transistor 74 acting as a diode with the base and collector short-circuited. The collector of the transistor 70 is connected to the junction of the resistors 26, 28 and 30 of the pre-amplifier stage. The emitter of the transistor 64, the collector of the transistor 66 and the collector of the transistor 74 are connected to the positive terminal of the D.C. power source 20. The transistors 64, 66, 70 and 74 jointly constitute a feedback stage of the power-amplifying circuit.

The operation of a power-amplifying circuit according to the first embodiment of this invention will be described. Now let it be assumed that a sine wave input signal in the form of alternately repeated positive and negative half cycle is supplied to the input terminal 10. The input signal is supplied to the base of the transistor 14 through a time-constant circuit formed of a capacitor 12 and resistor 22. Since the transistors 14 and 16 constitute a differential amplifier, then the collectors of the transistors 14 and 16 issue current signal corresponding to the input signals amplified in an inverted form and in a non-inverted form, respectively. The transistors 32 and 34 are respectively driven by the collector currents of the transistors 14 and 16. The transistors 42 and 44 are respectively driven by the collector currents of the transistors 32 and 34. The transistors 42 and 46 constitute a Darlington pair. The transistors 44 and 52 similarly constitute a Darlington pair. Therefore, the current signals corresponding to the input signals amplified in a non-inverted form and in an inverted form respectively flow through the transistors 46 and 52. The output terminal 60 sends forth an output signal corresponding to a difference between the amplitudes of the current signals flowing through the transistors 46 and 52, respectively. In other words, the output stage of the power-amplifying circuit acts as a push-pull amplifier. That portion of output signals from the transistors 46 and 52 which correspond to the D.C. voltage and part of the A.C. voltage is supplied to the base of the transistor 16 through a negative feedback path including the resistor 58.

The base-emitter voltages of the transistors 46 and 52 of the output stage are respectively supplied between the base and emitter of the transistors 50 and 56 through the corresponding compensation resistors 48, 68 and 54, 72. Therefore, the transistors 50 and 56, as well as the transistors 46 and 52, are driven by the emitter currents of the transistors 42 and 44. Now let it be assumed that the operating currents of the transistors 46, 52, 50, 56 and 70 (that is, the currents flowing therethrough) are expressed as $I_1$, $I_2$, $I_3$, $I_4$ and $I_F$, the emitter areas of the transistors 46 and 50 have a ratio of N:1, and the emitter areas of the transistors 52 and 56 also have a ratio of N:1. Then the operating currents $I_1$ and $I_3$ have the following relationship:

$$I_3 = (1/N)I_1 \quad (1)$$

The operating currents $I_2$ and $I_4$ have the following relationship:

$$I_4 = (1/N)I_2 \quad (2)$$

A potential at point A indicated in FIG. 1 may be expressed as a sum of the base-emitter voltage $V_{BE64}$ of the transistor 64 and the base-emitter voltage $V_{BE66}$ of the transistor 66 or a sum of the base-emitter voltage $V_{BE74}$ of the transistor 74 and the base-emitter voltage $V_{BE70}$ of the transistor 70. Now let it be assumed that the reverse saturation current of the PNP type transistor 64 is expressed as $I_{SP}$, the emitter areas of the transistors 64 and 70 have a ratio of $K_1$:1, the reverse saturation current of the NPN type transistor 66 is denoted by $I_{SN}$, the emitter areas of the transistors 66 and 74 have a ratio of $K_2$:1, and the current gains (the current amplification factors) of these transistors are large enough to neglect of the base currents. Then the base-emitter voltages of the transistors 64, 66, 74 and 70 may respectively be expressed as follows:

$$V_{BE64} = \frac{KT}{q} \ln \frac{I_3}{I_{SP}}$$

$$V_{BE66} = \frac{KT}{q} \ln \frac{I_4}{I_{SN}}$$

$$V_{BE74} = \frac{KT}{q} \ln \frac{I_F}{K_2 I_{SN}}$$

$$V_{BE70} = \frac{KT}{q} \ln \frac{I_F}{K_1 I_{SP}}$$

where:
k = Boltzmann constant
T = absolute temperature
q = charge of an electron The following relationship results from the above four equations relative to a potential at point A indicated in FIG. 1.

$$\ln \frac{I_3}{I_{SP}} + \ln \frac{I_4}{I_{SN}} = \ln \frac{I_F}{K_2 I_{SN}} + \ln \frac{I_F}{K_1 I_{SP}} \quad (3)$$

$$I_F = \sqrt{K_1 K_2 I_3 I_4} \propto \sqrt{I_3 I_4}$$

The current $I_F$ is supplied to the junction of the resistors 30, 26 and 28 of the pre-amplifier stage from the collector of the transistor 70. Therefore, the following relationship results.

$$R_{30}(I_F + I_{14} + I_{16}) + R_{28}I_{16} = V_{BE34} + R_{40}(I_{14} + I_{16})$$

$$\therefore I_F R_{30} = V_{BE34} + R_{40} \cdot I_0 - (R_{28} + 2R_{30})\frac{I_0}{2}$$

$$\approx V_{BE34} + (2R_{40} - R_{28} - 2R_{30})\frac{I_0}{2}$$

where:
$V_{BE32} \approx V_{BE34}$
$I_{14} = I_{16} = I_0/2$
$V_{BE32}$ = base-emitter voltage of the transistor 32
$V_{BE34}$ = base-emitter voltage of the transistor 34
$I_{14}$ = collector current of the transistor 14
$I_{16}$ = collector current of the transistor 16
$I_0$ = current flowing through the resistor 18
$R_{30}$, $R_{28}$ and $R_{40}$ = resistance values of the resistors 30, 28 and 40, respectively
$\beta$ = current amplification factor Thus, the collector current $I_F$ of the transistor 68 is substantially constant. Where, therefore, the operating current $I_1$ of the transistor 46 increases when the input signal is a positive half cycle, then the operating current $I_2$ of the transistor 52 decreases correspondingly. Further where the operating current $I_2$ of the transistor 52 increases when the input signal is a negative half cycle, then the operating current $I_1$ of the transistor 46 decreases correspondingly. In other words, the output stage of the power-amplifying circuit carries out a push-pull operation. Where no input signal is supplied, there results $I_1 \approx I_2$ (or $I_3 \approx I_4$). Therefore, the quiescent current $I_{idle}$ of the transistors 46 and 52 of the output stage may be expressed as follows:

$$I_{idle} = \frac{1}{\sqrt{K_1 K_2}} I_F \qquad (4)$$

Thus the quiescent current $I_{idle}$ can also be substantially constant. FIG. 2A shows the relationship between an input voltage V of the input signal and operating currents $I_3$ and $I_4$ respectively of the transistors 50 and 56 of the detection stage of the power-amplifying circuit. A dot-dash line denotes the value of the operating current $I_F$ of the transistor 70. The point on the dot-dash line where an input signal is zero denotes the quiescent current $I_{idle}$. Under an idle condition, operating currents $I_1$ and $I_2$ of the transistors 46 and 52 of the output stage and operating currents $I_3$ and $I_4$ of the transistors 50 and 56 of the detection stage satisfy the relationship represented by the aforesaid equations (1) and (2). Actually, however, the base-emitter voltage of an output transistor rises over a theoretically defined value due to the effect of a parasitic base resistance or parasitic emitter resistance at high currents. As a result, the operating currents of the detection transistors 50 and 56 do not satisfy the relationship expressed by the aforesaid equations (1) and (2). Consequently the operating currents of the detection transistors 50 and 56 eventually increase over a real value as shown in a broken line in FIG. 2A. Where the operating currents are small, the parasitic resistance does not effect the detection of the operating current. Though, therefore, the feedback current (the collector current of the transistor 70) $I_F$ may be regulated, a product of operating currents $I_1$ and $I_2$ of the output transistors 46 and 52 fails to be regulated. As a result, the problem arises that the operating current of the transistor in an operative cycle can not be made large enough to drive the load or the operating current of the transistor in an inoperative cycle is too small then the switching distortion arises. To counterbalance the effect of the above-mentioned parasitic resistance, therefore, a compensation resistor 48 is connected to the base of the transistor 50 of the detection stage, and a compensation resistor 68 is connected to the emitter of the transistor 50. A compensation resistor 54 is connected to the base of the transistor 56 of the detection stage, and a compensation resistor 72 is connected to the emitter of the transistor 56. For elimination of the effect of a parasitic resistance, the compensation resistors 48, 68, 54 and 72 well serve the purpose, provided they have such resistance as is equal to N times the value of a parasitic resistance (N denotes the above-mentioned value of a ratio between the emitter area of the output transistor 46 and that of the detection transistor 50). Connection of the compensation resistors 48, 68, 54 and 72 to the detection stage of the power amplifying circuit prevents the relationship of the aforesaid equation (3) from being disrupted, thereby providing an always stable feedback current and regulating the operating current of the output transistors 46 and 52.

The resistances of the compensation resistors 48 and 54 respectively connected to the bases of the transistors 50 and 56 are reduced to a reciprocal of the current amplification factor $\beta$ of the transistors 50 and 56. Therefore, the compensation resistors 48 and 54 need not be provided. Accordingly, the resistances of the compensation resistors 68 and 72 connected to the emitters of the transistors 50 and 56 may be increased by the extent of the resistances of the compensation resistors 48 and 54.

Where compensation resistors are used, a product of the operating currents $I_1$ and $I_2$ from the transistors 46 and 52 of the output stage, i.e. the output currents, is kept constant. Where, therefore, an output current from either of the output transistors 46 and 52 is increased, for example, 100 times, then an output current from the other transistor is reduced to 1/100. Where an output current reduce to 1/100 has too small a value, then notching or crossover distortions will arise. Therefore, the reduced output current should preferably have a large value. To meet the above-mentioned requirement, it is advised to let the compensation resistors 48, 68, 54 and 72 connected to the detection stage of the power-amplifying circuit have a resistance larger (N denotes the above-mentioned value of a ratio between the emitter areas of the transistors 46 and 50) than the N times value of a parasitic resistance occurring in the output transistors 46 and 52. Since the feedback current $I_F$ is regulated as seen from the aforesaid equation (3), an operating current $I_3$ of the transistor 50 for detecting an output current from the transistor 46 of the output stage which is in an operative cycle is reduced to a value smaller than $I_1/N$ by the compensation resistor 48 connected to the base of the transistor 50 and the compensation resistor 68 connected to the emitter of the transistor 50. Or an operating current $I_4$ of the transistor 56 for detecting an output current from the transistor 52 of the output stage which is in an operative cycle is reduced to a value smaller than $I_2/N$ by the compensation resistor 54 connected to the base of the transistor 56 and the compensation resistor 72 connected to the emitter of the transistor 56. As a result, the operating current $I_1$ or $I_2$ in an inoperative cycle is increased.

FIG. 2B indicates a comparison between an input voltage V and operating current $I_3$ flowing through the detection transistor 50 and also between the input voltage V and operating current $I_4$ flowing through the detection transistor 56, as determined when the aforesaid compensation resistors are and are not connected to the detection stage of the power-amplifying circuit. The solid lines of FIG. 2B represent the case where the compensation resistors are connected to the detection stage of the power-amplifying circuit. The broken lines of FIG. 2B show the case where the compensation resistors are not connected to the detection stage. FIG. 2B shows that where the compensation resistors are connected to the detection stage, and a decrease takes place in an output current from one of the transistors of the detection stage for detecting output currents from the transistors of the output stage which is in an operative cycle, then an output current from the other transistor of the detection stage is increased by the extent of the decrease.

The following Table 1 indicates the actually measured value of operating currents $I_1$, $I_2$, $I_3$ and $I_4$ flowing through the output transistors 46 and 52 and the detection transistors 50 and 56, as determined when the compensation resistors 48, 68, 54 and 72 are and are not connected to the detection transistors. To clarify the increasing current of the transistor in an operative cycle by the compensation resistor, the parasitic resistors of transistors 46 and 52 are neglected.

TABLE 1

| Current | When the compensation resistors are connected to the detection stage | When the compensation resistors are not connected to the detection stage |
|---|---|---|
| $I_1$ | 1 A | 1 A |
| $I_2$ | 0.1 mA | 1.0 mA |
| $I_3$ | 10 mA | 0.7 mA |
| $I_4$ | 0.001 mA | 0.009 mA |

Data given in Table 1 above is based on the assumption that the value N of the ratio between the emitter areas of the transistors 46 and 50 is 100, the resistance of the compensation resistors 48 and 54 is 0Ω, the resistance of the compensation resistors 68 and 72 is 100Ω, that is, $R_{48} = 100 + N \cdot Yex$ Ω under considering of parasitic resistors, ($R_{48}$: resistance value of the resistor 48, Yex: resistance value of the parasitic emitter resistor of the output transistor 46), the quiescent current of the transistors 46 and 52 where no input signal is supplied has a value of 10 mA, and an output current $I_1$ from the transistor 46 has a value of 1 A. As apparent from Table 1 above, the output current $I_4$ from the detection transistor 56 for detecting an output current from the output transistor 56 in the inoperative cycle has a value about 9 times larger and the output current $I_2$ from the output transistor 52 has a value about 10 times larger than when the compensation resistors 68 and 72 are not provided, thereby reducing a notching distortion and crossover distortion. Instead of connecting the compensation resistor 48 to the base of the transistor 50 of the detection stage and the compensation transistor 54 to the base of the transistor 56 of the detection stage, and the compensation transistor 68 to the emitter of the transistor 50 and the compensation transistor 72 to the emitter of the transistor 56, it is possible to connect a compensation resistor in series between the collector of the transistor 56 and the base of the transistor 70 and a compensation resistor similarly in series between the emitter of the transmitter 70 and the emitter of the transistor 74. Yet, the same effect is realized. In this case, a voltage corresponding to a product of the operating current $I_3$ of the detection transistor 50 and the operating current $I_4$ of the detection transistor 56 impresses between the base and emitter of the transistor 70. However, the current $I_F$ of the transistor 70 decreases by the above-mentioned series-connected compensation resistors. Where, therefore, the operating current $I_F$ of the transistor 70 is kept constant by a feedback loop, then the output currents of the output transistors 46 and 52 increase. As seen from FIG. 3, therefore, the operating current of one of the detection transistors does not appreciably decreases, though that of the other detection transistor may increase. Consequently, the same effect is ensured as when a compensation resistor is connected to a detection transistor. In this case, $\sqrt{I_3 I_4}$ increases with an input voltage as indicated in a broken line in FIG. 3.

The collector of the transistor 70 of the feedback stage may be grounded through a capacitor. In other words, the feedback path may or may not be by-passed to the ground in the A.C. mode. With the foregoing embodiment, the output stage is formed of NPN type transistors, enabling a power-amplifying circuit to have a large current capacity and further rendering the circuit suitable for integration.

A power-amplifying circuit according to a second embodiment of this invention is now described with reference to FIG. 4. A non-inverting input terminal 110 and an inverting input terminal 112 are respectively connected to the bases of PNP type transistors 114 and 116. The transistors 114 and 116 whose emitters are connected to each other jointly constitute a differential amplifier of a pre-amplifier stage. The emitters of the transistors 114 and 116 are connected to the positive terminal of a D.C. power source 120 through the collector-emitter path of a PNP type transistor 118. The collector of the transistor 114 is connected to the negative terminal of the D.C. power source 120 through the collector-emitter path of an NPN type transistor 122 and resistor 124. The collector of the transistor 116 is connected to the anode of a diode 126, whose cathode is connected to the negative terminal of the D.C. power source 120 through a resistor 128. The anode of the diode 126 is connected to the base of the transistor 122. The base of the transistor 118 is connected to the base of a PNP type transistor 130 acting as a diode with the base and collector short-circuited. The emitter of the transistor 130 is connected to the positive terminal of the D.C. power source 120. The collector of the transistor 130 is connected to the negative terminal of the D.C. power source 120 through resistors 132 and 134.

The collector of the transistor 114 is connected to the base of the NPN type transistor 136. The collector of the transistor 116 is connected to the base of an NPN type transistor 138. The collector of the transistor 138 is connected to the base of a PNP type transistor 140 and also to the emitter of the transistor 140 through a resistor 142. The emitter of the transistor 138 is connected to the emitter of the transistor 136 through a resistor 144. The collector of the transistors 140 and 136 are connected to each other. The collector of the transistor 140 is connected to an output terminal 146 of the power-amplifying circuit. The emitter of the transistor 140 is connected to the positive terminal of the D.C. power source 120. The emitter of the transistor 136 is connected to the negative terminal of the D.C. power source 120. In other words, the transistors 140 and 136 jointly constitute an output stage of the power-amplifying circuit. The transistor 138 forms a drive stage of the output transistor 140. Namely, the output stage is formed of common emitter complementary pair of PNP type and NPN type transistors. The base of the transistor 140 is connected to the base of a PNP type transistor 148. The base of the transistor 136 is connected to the base of an NPN type transistor 150. The collector of the transistor 148 is connected to the positive terminal of the D.C. power source 120. The emitter of the transistor 148 is connected to the collector of the transistor 150 and the base of a PNP type transistor 152. The emitter of the transistor 150 is connected to the negative terminal of the D.C. power source 120 through a compensation resistor 154. The emitter of the transistor 152 is connected to the cathode of a diode 156, whose anode is connected to the positive terminal of the D.C. power source 120. The collector of the transistor 152 is connected to the junction of the resistors 132 and 134. The transistors 148 and 150 jointly constitute the detection stage of the power-amplifying circuit. The transistor 152 constitutes a feedback stage.

Description is now given of the operation of a power-amplifying circuit according to the second embodiment. Where the input signal is supplied to the input terminals 110 and 112, the collectors of the transistors 114 and 116 respectively issues signals amplified in differential modes each other. The collector current of the transistor 116 drives the output transistor 140 through a phase invert transistor 138. The collector current of the transistor 114 drives the output transistor 136. Accordingly, the different phase signals impresses between the base and emitter of the output transistors 140 and 136, respectively. Then, the output transistors 140 and 136 carry out a push-pull operation. These amplified signals are drawn off at the output terminal 146.

The base potential of the output transistor 140 is supplied to the base of the detection transistor 148. The base potential of the output transistor 136 is fed to the base of the detection transistor 150 and the emitter potential of the transistor 136 is fed to the emitter of the detection transistor 150 through the compensation resistor 154. Output currents from these detection transistors 148 and 150 are supplied to the base of a transistor 152. The collector current of the transistor 152 is supplied to the pre-amplifier stage through a negative feedback path. Now let it be assumed that operating currents of the detection transistors 148 and 150 are respectively expressed as $I_5$ and $I_6$, and an operating current of the transistor 152, namely, the feedback current is denoted by $I_F$. Then, the following relationship arises between the operating currents of the detection transistors 148, 150 and 152:

$$I_F \propto \sqrt{I_5 I_6} \tag{5}$$

Referring to FIG. 4, a compensation resistor 154 connected to the emitter of the detection transistor 150 carries out the same action as the compensation resistors 54 and 72 shown in FIG. 1, and are chosen to have the same value of resistance. The detection transistor 148 is not connected to a compensation resistor like the compensation resistors 48 and 68 indicated in FIG. 1. With the second embodiment of FIG. 4, therefore, only in the half cycle of the input signal, the effect of a parasitic resistance occurring in the output transistor 136 can be suppressed. Depending, however, on the application of the power-amplifying circuit according to the second embodiment, the above-mentioned arrangement still well serves the purpose. Further as in the first embodiment, the collector of the transistor 152 may be grounded through a capacitor.

A power-amplifying circuit according to a third embodiment of this invention is now described with reference to FIG. 5. An input terminal 210 is connected to the base of an NPN type transistor 212, whose emitter is connected to the emitter of an NPN type transistor 214 and also to the negative terminal of a D.C. power source 218 through a resistor 216. The bases of the transistors 212 and 214 are grounded through the corresponding resistors 220 and 222. The collector of the transistor 212 is connected to the emitter of a PNP type transistor 228 through a resistor 224. The collector of the transistor 214 is connected to the emitter of a PNP type transistor 230 through a resistor 226. The bases of the transistors 228 and 230 are connected together and further connected to the negative terminal of a sub D.C. power source 232, whose positive terminal is connected to the positive terminal of the D.C. power source 218. The collectors of the transistors 212, 214 are connected to the positive terminal of the D.C. power source 218 through the corresponding resistors 234 and 236. The emitters of the transistors 228 and 230 are connected to the positive terminal of the D.C. power source 218 through the corresponding resistors 238 and 240. The collectors of the transistors 228 and 230 are respectively connected to the bases of NPN type transistors 242 and 244, and also to the negative terminal of the D.C. power source 218 through the corresponding resistors 246 and 248. An NPN type transistor 250 and the transistor 242 constitute a Darlington circuit. The collector of the transistor 250 is connected to the positive terminal of the D.C. power source 218. The emitter of the transistor 250 is connected to the anode of a diode 252, whose cathode is connected to the anode of a diode 254. The cathode of the diode 254 is connected to the collector of an NPN type transistor 256. The transistors 256 and 244 constitute a Darlington circuit. The emitter of the transistor 256 is connected to the negative terminal of the D.C. power source 218. The junction of the diodes 252 and 254 is connected to the base of the transistor 214 through a resistor 258 and also to the output terminal 260. The output terminal 260 is grounded through a resistor 262. In other words, an output stage of the power-amplifying circuit is formed of the NPN type transistors 250 and 256. The diodes 252 and 254 constitute a detection stage. The anode of the diode 252 is connected to the bases of NPN transistors 264 and 266. The emitter of the transistor 264 is connected to the anode of a diode 270 through a compensation resistor 268. The collector of the transistor 264 is connected to the collector of the transistor 214 through the emitter-collector path of an NPN type transistor 272. The emitter of the transistor 266 is connected to the anode of a diode 276 through a compensation resistor 274. The cathodes of the diodes 270 and 276 are connected to the collector of the transistor 256. The collector of the transistor 266 is connected to the collector of the transistor 212 through the emitter-collector path of an NPN type transistor 278. The bases of the transistors 272 and 278 are connected to the base of the transistor 250.

Where, with the third embodiment, an input signal has a positive value, then the transistor 250 is supplied with an amplified signal. Where an input signal has a negative value, then the transistor 256 is supplied with an amplified signal. These amplified signals are drawn off at the output terminal 260. Operating currents from the transistors 250 and 256 are detected by the corresponding diodes 252 and 254. The transistors 264 and 266 are driven in accordance with the detected operating currents of the transistors 250 and 256. In this case, currents flowing through the transistors 264 and 266 have the same value. Where, therefore, the operating currents of both transistors 264 and 266 are collectively expressed as $I_F$ and operating currents of the output transistors 250 and 256 are respectively denoted by $I_7$ and $I_8$ then following relation results, because a voltage impressed across both ends of a series circuit formed of the diodes 252 and 254 has the same level as a voltage impressed across both ends of a series circuit formed of the compensation resistor 268 and diode 270:

$$I_F \propto \sqrt{I_7 I_8}$$

A current actually supplied to the pre-amplifier stage of the power amplifying circuit through negative feedback loop decreases from a current value denoted by the above formula by the extent of a value corresponding to a voltage drop effected by the compensation resistor 268. As a result, the operating current of the output transistor 250 increases by the extent of the voltage drop. Therefore, the operating current of an output transistor in an operative cycle is not appreciably reduced. The first, second and third embodiments may be biased in classes A, B and AB.

What we claim is:

1. A power-amplifying circuit comprising:
   pre-amplifier means for amplifying an input signal and sending forth amplified output signals in differential modes with respect to each other;
   output means including first and second transistors jointly carrying out a push-pull operation in accordance with the polarity of said output signals from the pre-amplifier means; and
   operation means which detects output signals from the first and second transistors, supplies a signal corresponding to a product of both output signals to said pre-amplifier means through a negative feedback path to regulate signals of the first and second transistors and is provided with a compensation resistor connected to a signal path extending from said output means to said pre-amplifier means having a resistance for counterbalancing a parasitic resistance occurring in the first and second transistors.

2. The power-amplifying circuit according to claim 1, wherein said operation means includes third and fourth transistors whose bases are respectively connected to the bases of the first and second transistors, and whose emitters are respectively connected to the emitters of the first and second transistors; a circuit for supplying a current corresponding to a product of output currents from the third and fourth transistors to said pre-amplifier means; and a compensation resistor connected to one of the bases and emitters of the third and fourth transistors.

3. The power-amplifying circuit according to claim 1, wherein said operation means includes first and second diodes connected in series between the first and second transistors; a third transistor, between whose base and emitter the first and second diodes are connected, and which supplies a current corresponding to a product of currents flowing through the first and second diodes to said pre-amplifier means; and a compensation resistor connected to either of the base and emitter regions of the third transistor.

4. The power-amplifying circuit according to claim 2, wherein the compensation resistor has a resistance equal to a value arrived at by multiplying a parasitic resistance occurring in the first transistor by a multiplier larger than the value of a ratio between the emitter areas of the first and third transistors.

5. The power-amplifying circuit according to claim 3, wherein the compensation resistor has a resistance equal to a value arrived at by multiplying a parasitic resistance occurring in the first transistor by a multiplier larger than the value of a ratio between the emitter area of the first transistor and the cathode area of the first diode.

* * * * *